United States Patent [19]
Kleks

[11] Patent Number: 5,606,320
[45] Date of Patent: Feb. 25, 1997

[54] METHOD AND APPARATUS FOR MICROPOWER ANALOG-TO-DIGITAL CONVERSION IN AN IMPLANTABLE MEDICAL DEVICE

[75] Inventor: Jonathan A. Kleks, Northridge, Calif.

[73] Assignee: Pacesetter INc., Sylmar, Calif.

[21] Appl. No.: 349,858

[22] Filed: Dec. 6, 1994

[51] Int. Cl.$^6$ ................................................. H03M 1/38
[52] U.S. Cl. ........................... 341/161; 341/118; 341/165
[58] Field of Search ................................... 341/118, 165, 341/155, 144, 161

[56] References Cited

U.S. PATENT DOCUMENTS

| | | | |
|---|---|---|---|
| 4,228,423 | 10/1980 | Schwerdt | 340/347 AD |
| 4,590,458 | 5/1986 | Evans et al. | 340/347 AD |
| 4,814,642 | 3/1989 | Kleks | 307/350 |
| 4,982,194 | 1/1991 | Bacrania et al. | 341/172 |

OTHER PUBLICATIONS

Gordon, Bernard M., "Linear Electronic Analog/Digital Conversion Architectures, Their Origins, Parameters, Limitations, and Applications," *Data Conversion Integrated Circuits*, IEEE Press (New York 1980), pp. 32–68.

Zuch, Eugene L., "Principles of Data Acquisition and Conversion," *Data Acquisition and Conversion Handbook*, DATEL (Massachusetts 1979).

*Primary Examiner*—Jeffrey A. Gaffin
*Assistant Examiner*—Jason L. W. Kost
*Attorney, Agent, or Firm*—Lisa P. Weinberg

[57] ABSTRACT

A micropower analog-to-digital converter (ADC) for use in an implantable medical device is disclosed. The ADC achieves a high conversion speed at micropower levels through a number of timing and circuit improvements over the conventional implementation of the successive approximation ADC architecture. The ADC includes a digital-to-analog converter (DAC) that preferably is implemented as a binary-weighted, switched capacitor array that employs top plate charging and performs bipolar conversion. The DAC provides an analog output signal representing array charge to a comparator. During a comparator latch phase, the DAC asynchronously determines a bit of the ADC digital output signal in response to the comparator output, and initiates a test of the next least significant bit during the same latch phase. Further, the DAC analog output signal is timed to settle during the latch phase in response to both the bit update and the next bit test. In conjunction with increasing conversion speed, the DAC reduces power requirements by using a power gated buffer that selectively increases the power of the ADC input signal only when necessary to drive the ADC conversion circuitry. Further, the comparator includes a precharged static memory cell to avoid crossover currents. Finally, the ADC includes a digital offset correction DAC that corrects not only the cumulative offset voltage generated by components of the ADC, but also the offset voltage of any device that provides the ADC input.

26 Claims, 7 Drawing Sheets

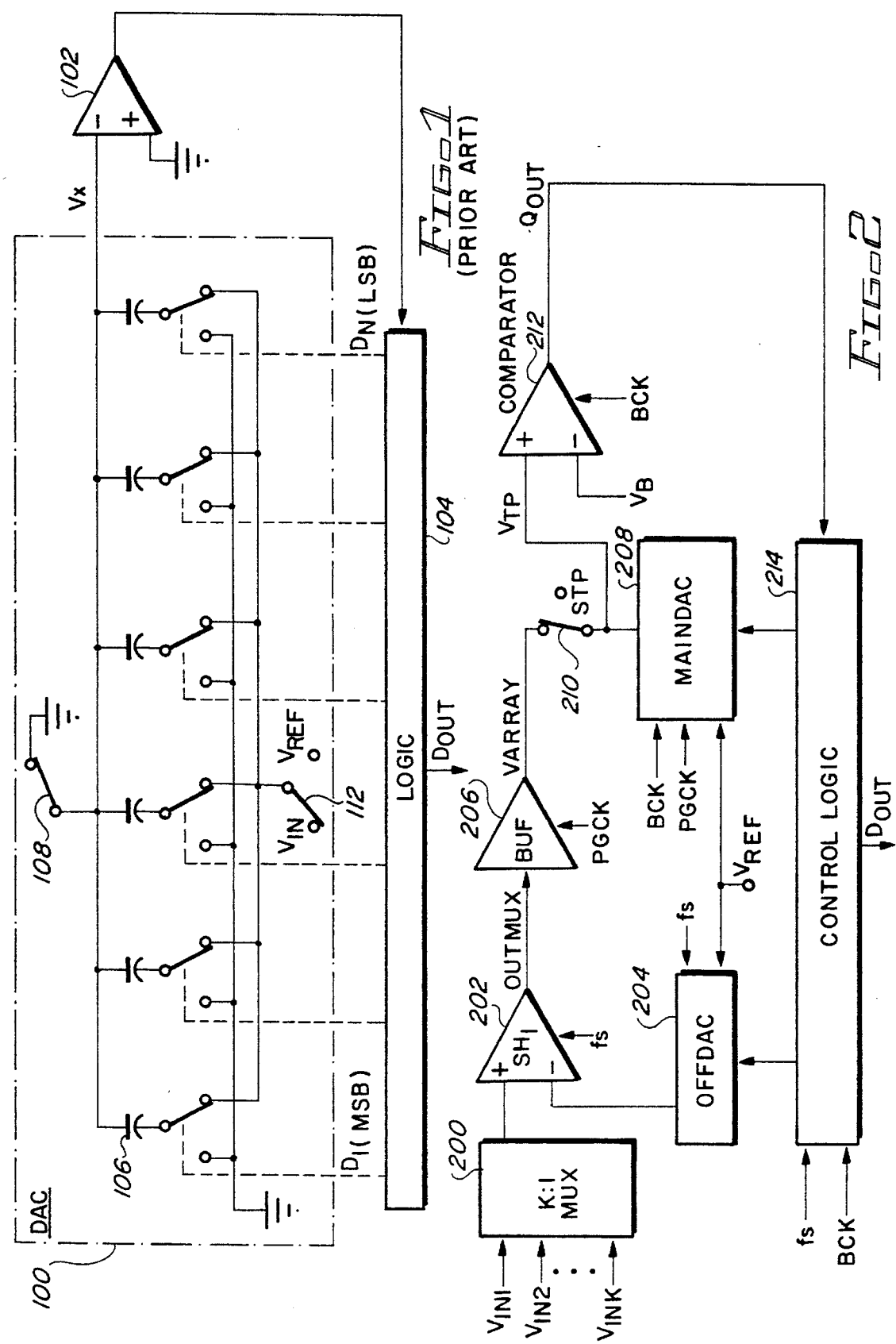

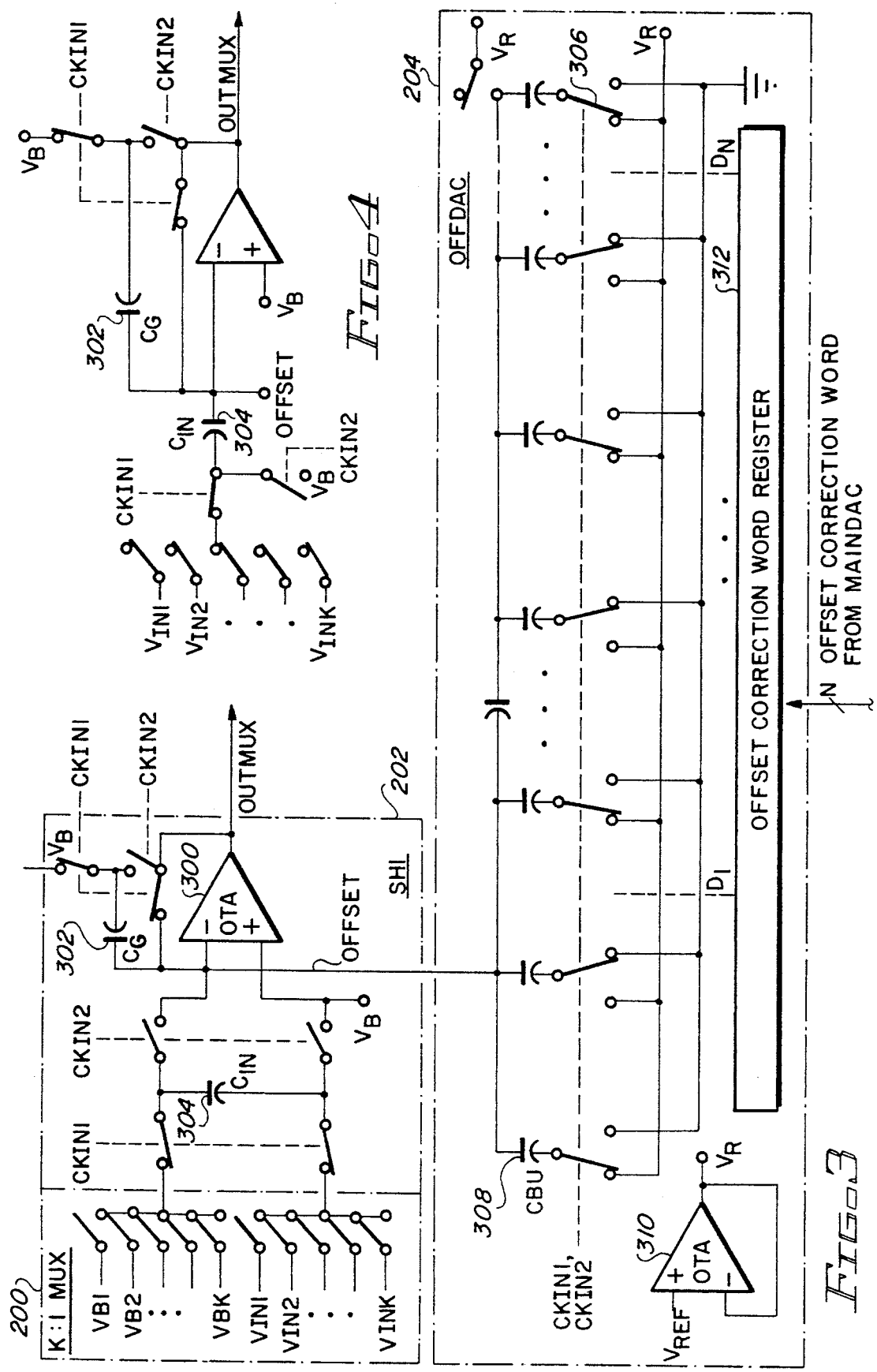

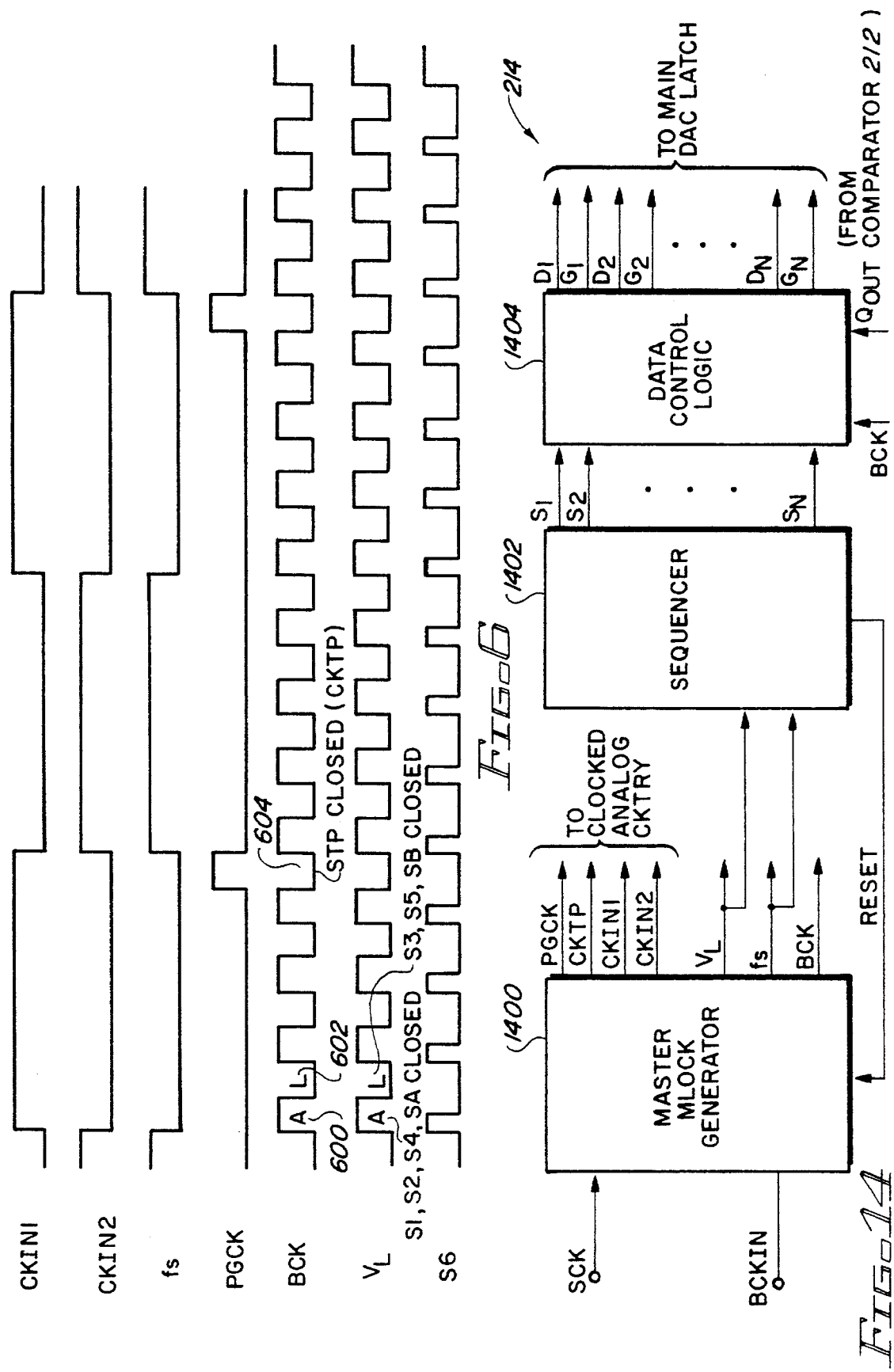

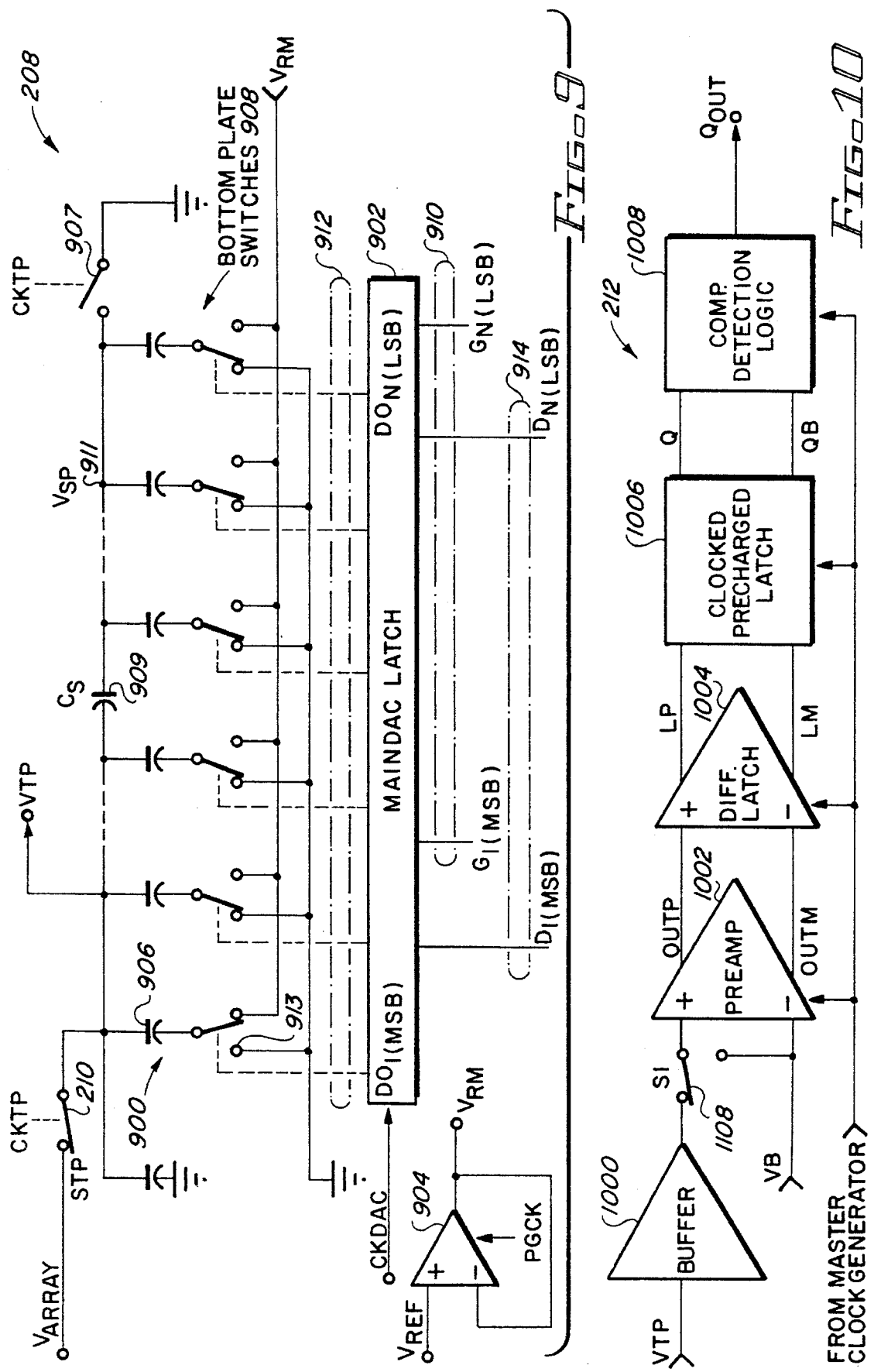

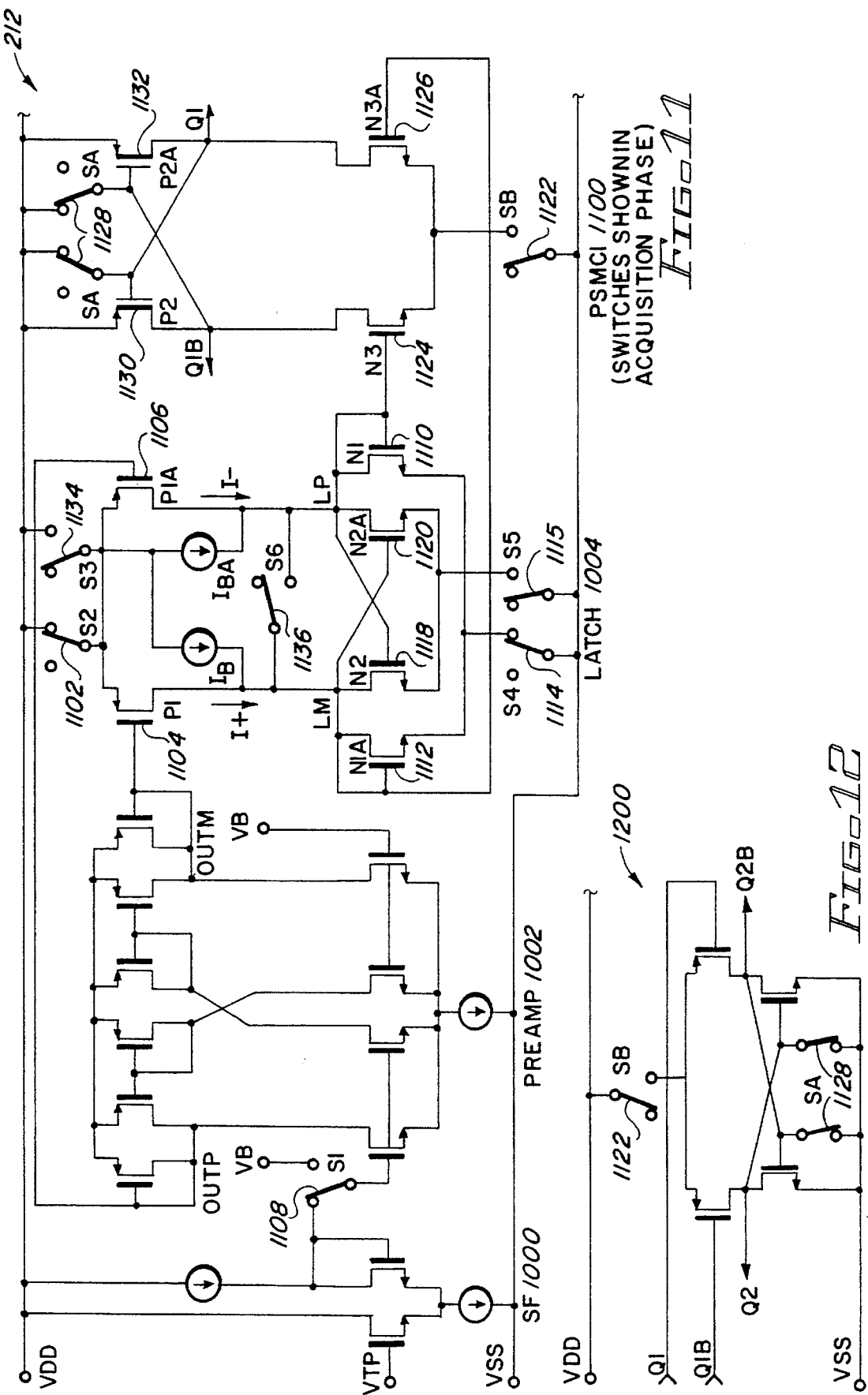

METHOD AND APPARATUS FOR MICROPOWER ANALOG-TO-DIGITAL CONVERSION IN AN IMPLANTABLE MEDICAL DEVICE

FIELD OF THE INVENTION

The present invention relates to data conversion and, more particularly, to an analog-to-digital converter that operates at micropower levels for use in an implantable medical device.

BACKGROUND OF THE INVENTION

Many battery-powered electronic products require so-called "micropower" data conversion circuitry that drains extremely low levels of battery current. In particular, implantable medical products require micropower analog-to-digital converters (ADCs) that operate at low voltage and low current. Pacemakers, for example, include miniature transmitters for transmitting to an external receiver a wide variety of signals concerning the heart or the state of the pacemaker itself. A physician may monitor electrocardiogram signals detected by the pacemaker to determine whether pacemaker parameters, such as shock voltage or pacing rate, need to be adjusted. Alternatively, the physician may need to examine measured data concerning battery voltage or lead impedance to determine whether the pacemaker requires replacement.

The complex signals measured by the pacemaker can be transmitted to the external receiver in analog form. As an illustration, the pacer may measure the voltage of an ECG signal and use that voltage to create a frequency modulated (FM) signal by employing a voltage controlled oscillator (VCO). The external receiver would demodulate the FM signal to recover the analog ECG waveform. A major problem with this technique lies in the fact that this analog modulation scheme is highly susceptible to noise, resulting in an unreasonably noisy signal at the external receiver.

Converting the signals measured by the pacer to digital form before transmission overcomes many of the problems encountered in analog telemetry. Digital signals are inherently less susceptible to noise and permit the pacer to take advantage of noise reduction techniques well known in the field of digital signal processing. In addition, providing a clean digitized signal, such as an ECG waveform, to a physician allows a comprehensive examination of the waveform morphology of cardiac signals. Important parameters such as ECG amplitude, slope and frequency content can be analyzed.

The widespread use of ADCs to provide digital data has been hampered by the stringent power requirements of implantable medical devices. The power consumed by those devices is one of the most important design factors. Implantable systems are customarily powered by a long-lasting non-replaceable internal battery. As an example, the life of a pacemaker battery averages approximately five to seven years. During normal operation, conventional pacemakers experience a current drain on the order of tens of micro amperes (mA), while conventional low-power ADCs drain on the order of 0.1 to 1.0 mA. When the battery voltage decreases below a prescribed amount, the entire pacemaker must be surgically replaced. Consequently, it is desired to keep ADC power drain to the lowest possible level to minimize the need for pacer battery replacement.

Obtaining a low enough current drain is usually accomplished by drastically reducing the sample rate. This limits the conversion bandwidth of the ADC and so may compromise its ability to properly encode dynamic signals. Alternatively, one may sacrifice resolution (bits) to obtain lower current at a desired sample rate. This limits accuracy. What is needed is an ADC that can sample different types of signals (measured data, IEGM, sense amp, sensors, etc.) at the appropriate sample rate and resolution while at the same time drawing an acceptable current drain. An ADC with these capabilities may be multiplexed with any of these input signals to allow multiple input signal sources to share the same ADC. Multiplexing saves chip area and reduces current by eliminating the redundant conversion circuitry that would otherwise be dedicated to each signal.

Device design considerations dictate the selection of the optimal ADC architecture for a given data acquisition environment. For example, a cardiac pacemaker manufactured by the assignee of the present invention requires a multiplexed ADC that consumes less than one mA of current and operates at a sample rate on the order of one kilosample per second (KSPS). The ADC must also exhibit a resolution of approximately eight bits and operate with a supply voltage range of approximately −1.8 to −2.8 volts.

The successive approximation architecture is an effective implementation that meets the above-mentioned constraints. This architecture calculates a bit at a time and thus inherently requires less power than a parallel architecture such as a flash ADC, which requires $2^n-1$ comparators for an n-bit converter. Alternatively, an integrating slope converter is unsatisfactory because it requires a very high speed internal clock to achieve each bit of resolution. Finally, a sigma delta modulation architecture cannot be used for multiplexed input signals because the sigma delta architecture relies on the correlation between successive signal samples, while successive multiplexed samples from different signal sources are inherently uncorrelated. As a consequence, the successive approximation architecture is an optimal micropower ADC architecture.

FIG. 1 illustrates a conventional successive approximation ADC, which includes a digital-to-analog converter (DAC) 100, a comparator 102 and control logic circuitry 104. As is well known in the art, the DAC of a successive approximation ADC that is employed in low power CMOS applications is often implemented using a binary weighted, switched capacitor array 106, such as that shown in FIG. 1. High quality capacitors can be fabricated in double poly CMOS processes. Moreover, matching of these capacitors to within a 0.1% error measure has been demonstrated. Matching of the relative values of the capacitors in a binary weighted array is crucial to obtaining an accurate, linear digital conversion.

Based on an analog input voltage $V_{IN}$ and a reference voltage $V_{REF}$, the DAC 100 initially provides a first approximation to the analog voltage $V_{IN}$. This first approximation is the analog version of a digital code word $D_{out}$ provided by the logic 104. For example, the most significant bit (MSB) $D_1$ of the control logic 104 may initially be set to one (1) and the remaining bits to zero (0) in order to represent a midrange value. The resulting analog output of the DAC 100 is input to the comparator 102 effectively to determine whether the approximation is greater than or less than the input voltage $V_{IN}$. Based upon this decision, the logic 104 respectively sets or resets the MSB. This process is continued with subsequent bits until a code word $D_{out}$ representing the input analog voltage $V_{IN}$ is achieved.

In the conventional architecture, the input voltage $V_{IN}$ enters the ADC through the bottom plates of the capacitors in the array 106. Each bit conversion is accomplished through a sequence of three operations. In the first operation, the "sample mode," the top plate is connected to ground by a top plate grounding switch 108 and the bottom plates are connected to the input voltage $V_{IN}$ by a configuration of bottom plate grounding switches 110 and a bottom plate input switch 112. This results in a stored capacitor charge that is proportional to the input voltage $V_{IN}$. In the "hold mode," the top grounding switch 108 is opened and the bottom plates are connected to ground by bottom plate grounding switches 110. Because of the conservation of charge, the top plate potential goes to $-V_{IN}$. The "redistribution mode" begins by testing the value of the most significant bit (MSB) by raising the bottom plate of the largest capacitor to the reference voltage $V_{REF}$ by a proper configuration of the switches. The voltage $V_x$ at the input to the comparator 102, which was equal to $-V_{IN}$ previously, is now increased by one-half the reference voltage as a result of this operation, so that $$V_x = -V_{IN} + V_{REF}/2.$$

The output of the comparator is one (1), and the MSB $D_1$ is set to 1, if $V_{IN} > V_{REF}/2$, while the comparator output and the MSB $D_1$ is set to zero (0) if $V_{IN} < V_{REF}/2$. The output of the comparator therefore is the value of the binary bit being tested. Typically, the settling of the DAC 100 in response to the comparator update and the comparator acquisition of a new input must occur together in the same one-half of a bit-clock cycle time (the acquisition phase). The other half cycle is dedicated to the comparator latching operation in which the comparator output is provided at a logic level to update the bit. The above-described sequence of operations is repeated for each bit to complete the conversion process.

A number of error sources found in conventional successive approximation ADCs result in increased power consumption and a reduction in conversion speed. For example, a disadvantage of the bottom plate charging method is that one-half of a bit-clock cycle time must be spent opening the top grounding switch 108 and grounding the bottom plates to shift the input voltage potential to the top plate for comparison by the comparator 102. The alternative to this method would be to introduce the input voltage to the top plates initially. However, the capacitor switches are implemented using FETs, for which the channel charge injected into the top plate is a function of $V_{IN}$. This signal dependent charge integrates onto the top plate capacitance to cause an input signal hold pedestal. The pedestal creates offset, gain, and distortion errors in the final ADC conversion result. As a consequence, in conventional ADCs, the bottom plate charging method is preferred, even though it requires an extra conversion step.

Offset errors introduced by the different components comprising the ADC are also encountered in analog-to-digital converters. A typical ADC implements buffers and comparators using subcircuits such as operational amplifiers (op amps). The ideal op amp responds to a zero input voltage with a zero output voltage. However, in actual operation, because of device non-idealities, a small input offset voltage exists between the differential terminals of an op amp even when no input voltage is applied. The cumulative effect of the offset voltages found in the components of an ADC results in an offset error in the digital conversion output.

Typically, offset voltage is eliminated as a source of error by a technique known as auto-zeroing. Auto-zeroing is a technique that is well known in the art. Two good references in the art which explain this, as well as other techniques related to the invention, are *Analog MOS Integrated Circuits for Signal Processing*, Gregorian, Temes et al. (Wiley and Sons—1986) and *Switched Capacitor Circuits*, Allen, Sanchez-Sinencio et al. (Van Nostrand Reinhold—1984).

Auto-zeroing is a popular technique, but it typically requires unity gain stability of the circuit being auto-zeroed, which reduces its bandwidth and thereby increases power. This problem is especially true for the ADC comparator which operates at a multiple of the sampling rate, and whose speed ultimately limits the conversion speed of the ADC. Moreover, the accuracy of the auto-zero technique is limited by switch charge injection and so requires a relatively large capacitance to achieve a sufficient level of offset correction. The cumulative effect is the addition of a large capacitance to the entire analog-to-digital converter. The charging of this capacitance consumes power and slows the overall conversion speed because of the additional time required to charge the larger capacitors. Further, each auto-zeroed op amp is typically implemented using two gain stages cascaded or one gain stage cascoded to obtain satisfactory offset cancellation. These op amps are wasteful of power and may degrade conversion speed significantly.

Another factor mitigating against micropower operation is the high current required to quickly charge the large capacitance of the DAC capacitor array to VIN.

The circuitry driving the array with the input and reference voltages typically must operate at relatively high power to charge the array at a sufficiently high rate.

Further, the comparator must rapidly amplify small signals up to full logic levels to determine each bit of the resulting ADC output. The comparator is biased at a low current input as part of the overall effort to minimize current drain. Unfortunately, starving the comparator in this manner can cause the comparator output to exhibit unacceptably slow slew rates. Slow slew rates can lead to disastrous crossover currents in subsequent logic circuitry. The crossover currents cause high current spikes, resulting in a substantial drain on the battery supplying the ADC.

It is therefore appreciated that there exists a substantial need for an analog-to-digital converter which is capable of operating in an implantable medical device at a rate fast enough to acquire rapidly changing data, while at the same time minimizing current consumption.

SUMMARY OF THE INVENTION

The present invention provides a method and apparatus for micropower analog-to-digital conversion in an implantable medical device. The structural and timing features of the ADC of the present invention, both alone and in combination with each other, overcome drawbacks found in the prior art. In particular, these novel features make possible micropower analog-to-digital conversion at a rate suitable for use in an implantable medical device.

The present invention achieves a high conversion speed through a number of improvements in ADC timing. Preferably, the micropower ADC of the present invention uses a successive approximation architecture for converting an analog input signal into a digital output signal. The analog input signal may represent a biophysical characteristic measured by an implantable medical device or an electrical characteristic of the implantable medical device itself.

The ADC preferably includes a DAC having a binary-weighted, switched capacitor array for receiving a sampled version of the analog input signal to initially charge the capacitor array. A DAC analog output signal provides a measure of the charge of the array, while switch positions of the array capacitors represent bits of the digital output signal. A comparator compares the DAC output signal to a bias voltage to generate a comparator output signal. During an acquisition phase, the comparator acquires the difference of the DAC output and the bias voltage to provide a difference signal. During a subsequent latch phase, the comparator amplifies the difference signal to a logic level to produce the comparator output signal.

An improvement in conversion timing is achieved by asynchronously determining each bit of the digital output signal in response to the comparator output signal when the comparator output signal increases to a logic level in the latch phase. Further, the analog DAC output signal representing the array charge is timed to settle during the latch phase in response to the determination of the DAC bit. Settling the DAC output signal outside of the acquisition phase results in a substantial reduction in required acquisition phase duration and a corresponding decrease in ADC power requirements.

Even further improvements in conversion speed are achieved by not only updating the DAC bit during the latch phase, but also by initiating the test of the next least significant bit during the same phase, and allowing the DAC analog output signal to settle in response to the next bit test as well as the bit update.

Moreover, the present invention preferably employs top plate charging of the DAC array to avoid the need for a charge redistribution phase from the bottom plate to the top plate during the determination of the most significant bit of the digital output signal. Finally, one-half of a bit-clock cycle is also saved by presetting the most significant bit of the ADC to perform bipolar conversion starting at a midrange digital output signal value.

In conjunction with increasing conversion speed, the present invention also reduces ADC power requirements. A power gated buffer of the present invention is interposed between what could be considered the front and back ends of the ADC. The front end includes sampling circuitry, which operates at low frequency and low power to generate a sampled analog input signal. The back end, which performs the mechanics of the conversion, however, must operate at a high frequency and a relatively high power to drive the capacitor array and the comparator. According to the present invention, the power gated buffer includes a switched buffer amplifier that receives the sampled analog input signal from the sampling circuitry and provides a buffered output signal representing the input. A power gating switch switches the operating power level of the switched buffer amplifier from a low operating power level during a first phase to a high operating power level during a second phase to thereby provide a power gated buffer output signal. The signal is provided during the second phase to the back end of the ADC before the back end begins determining the most significant bit of the digital output. Thus, the power gated buffer isolates the front end from the back end to permit the front end to continuously run at low power. Further, the power gated buffer itself only runs at high power when necessary to provide the sampled input signal to the conversion circuitry of the back end.

The present invention also incorporates a comparator that runs at current-starved levels without causing crossover currents that would normally occur due to the slow slew rates of conventional low power comparators. The micropower comparator of the present invention includes a synchronous high gain differential amplifier that amplifies its differential input to a logic level during the latch phase to thereby produce a differential latch output signal. To avoid crossover currents, the micropower comparator includes one or more precharged static memory cells (PSMCs) of the present invention that increase the slew rate of the differential output signal without drawing crossover current. The PSMCs are preferably cascaded until the slew rate of the output signal of the PSMC cascade is sufficiently fast enough to eliminate crossover currents. A comparator detection logic circuit provides the final comparator output upon detecting that the output signal provided by the PSMCs has reached a logic level.

Another power-saving feature of the present invention is found in the manner in which it corrects offsets inherent not only to the ADC itself, but also in the devices providing inputs to the ADC. Preferably, the ADC includes an offset correction DAC of the present invention that employs an offset correction word register for storing a digital offset correction word that represents an input-referred offset voltage. A DAC component of the offset correction DAC converts the offset correction word to an offset correction charge that is injected into any inverting summing point of the front end of the ADC. For example, the offset correction charge may be injected into an inverting input of a sample-and-hold circuit within the sampling circuitry of the ADC front end.

The offset correction word may represent the digital output signal of the ADC in response to an analog input signal having a zero value, in which case the offset correction word represents the cumulative offset voltage generated by the components of the ADC. Further, the analog input signal to the ADC is typically provided by an analog signal processing device in the implantable medical device. The offset correction word may thus also represent the digital output signal of the ADC in response to an analog input signal that represents an offset voltage generated by the analog signal processing device. In that case, the offset correction DAC not only corrects the cumulative offset voltage generated by the ADC components, but also corrects for the offset voltage of the analog signal processing device providing the ADC input.

The present invention thus provides a wide variety of improvements both in timing and circuit structure that permit micropower analog-to-digital conversion at conversion rates required in implantable medical devices.

BRIEF DESCRIPTION OF THE DRAWINGS

The objects, features and advantages of the present invention will be apparent from the following detailed description in which:

FIG. 1 is a schematic of a prior art successive approximation analog-to-digital converter (ADC) using a binary weighted switched capacitor array.

FIG. 2 is a system block diagram of the ADC of the present invention.

FIG. 3 illustrates the front end of the ADC of the present invention including a multiplexer, a sample-and-hold circuit, and an offset correction DAC.

FIG. 4 is an alternative embodiment of the multiplexer and the sample-and-hold circuit of FIG. 3.

FIG. 6 illustrates a timing diagram for the ADC of the present invention.

FIG. 9 illustrates the MAINDAC of the present invention.

FIG. 10 is a system block diagram of the comparator of the present invention.

FIG. 11 is a circuit level diagram of the comparator of the present invention.

FIG. 12 illustrates an embodiment of the precharged static memory cell of the present invention.

FIG. 14 is a block diagram of the control logic of the present invention.

DETAILED DESCRIPTION OF THE INVENTION

Figure 5:
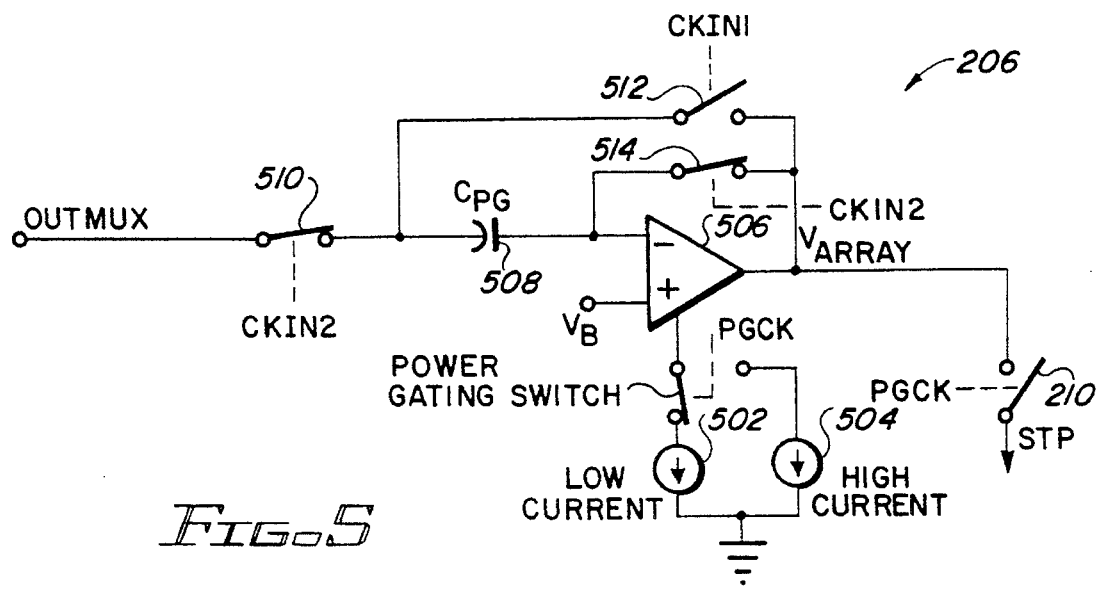
FIG. 5 illustrates the power gated buffer of the present invention.

The present invention provides a method and apparatus for micropower analog-to-digital conversion in an implantable medical device. For purposes of explanation, specific details are set forth to provide a thorough understanding of the present invention. However, it will be apparent to one skilled in the art that the invention may be practiced without these details. In other instances, well known elements, devices, process steps and the like are not set forth in detail in order to avoid obscuring the present invention.

Overview Of The Micropower ADC

FIG. 2 is a block diagram of the analog-to-digital converter of the present invention. A variety of analog input signals, $V_{IN1}$, $V_{IN2}$, ..., and $V_{INK}$, are made available as inputs to a k-to-1 multiplexer (k:1 MUX) 200, which selects the input to be digitized. The analog inputs may represent the ECG signal or the battery voltage of a cardiac pacemaker, for example.

The output of the multiplexer 200 is coupled to a sample-and-hold circuit SH1 202, running at a sampling rate of $f_s$. Sample-and-hold circuits are well known in the art. The sample-and-hold circuit also receives an inverted input from an offset correction DAC (OFFDAC) 204, which provides a global offset correction signal, as explained in detail below.

The sampled output, OUTMUX, is fed to a power gated buffer 206 of the present invention, which drives the top plates of a binary-weighted capacitor array found in a primary DAC, MAINDAC 208, that performs a digital-to-analog conversion. A power gated clock signal (PGCK) clocks the buffer 206. A switch STP 210 isolates the power gated buffer 206 and its output, $V_{ARRAY}$, from the MAINDAC 208.

A comparator 212 compares the MAINDAC 208 top plate voltage, $V_{TP}$, to a bias voltage, $V_B$. The comparator result, $Q_{OUT}$, is fed into a control logic circuit 214, which sets the switches of the switched capacitor array in the MAINDAC 208 according to the comparator output. The switch values, whether high or low, are output as a series of bits (e.g., serial bit stream) from the control logic 214 as the digital representation, $D_{OUT}$, of the analog-to-digital converter of the present invention.

The control logic 214 receives the sampling clock signal, $f_s$, and a bit-clock signal, BCK. BCK runs at a frequency $Nf_s$, where N is the number of bits in the binary representation of the analog signal. Clearly, because the present invention uses a serial successive approximation ADC, the present invention must calculate a new bit at a rate $Nf_s$ to provide a complete binary representation of an analog sample for every sample period $1/f_s$.

Front End Block

FIG. 3 illustrates an embodiment of the front end block of the present invention, including MUX 200, SH1 202 and OFFDAC 204. In one embodiment, the input MUX 200 is implemented as a differential analog multiplexer receiving the analog input voltage signals, $V_{IN1}$, $V_{IN2}$, ..., and $V_{INK}$, and corresponding bias voltages, $V_{B1}$, $V_{B2}$, ..., $V_{Bk}$, which are selected to maintain the differential input voltages within a predetermined full scale input range of the ADC. The differential analog MUX 200 is implemented in MOS technology, as is the entire ADC in this embodiment. As is well known in the art, MOS transistors exhibit charge injection effects in the form of offset gain and distortion errors. However, because the MUX input in this embodiment is differential, the charge injection effects of the MUX 200 cancel at the differential input of the sample-and-hold circuit 202 (by using proper switch phasing known in the art).

The sample-and-hold (SH1) 202 is a standard switched capacitor, offset compensated amplifier 300 with a gain capacitor $C_G$ 302 in the feedback path and a common bias voltage $V_B$ applied to the positive input terminal. Preferably, all signal path and reference buffer (described below) amplifiers of the present invention are single-stage operational transconductance amplifiers that are biased in weak inversion.

Switches in the MUX 200 and SH1 202 stages are clocked by CKIN1 and CKIN2, which are two-phase, non-overlapping clock signals running at the sampling frequency $f_s$ (shown in FIG. 6). When a clock is high, its associated switch is closed. During the first phase, CKIN1 is high, which results in the charging of an input capacitor $C_{IN}$ 304 of SH1 202 by the differential input voltage. CKIN2 is low, thereby isolating $C_{IN}$ 304 from any non-ideal or settling effects of the SH1 amplifier 300. During the second phase, CKIN1 is low and CKIN2 is high, resulting in a flipping of the respective switches. This action isolates the input capacitor $C_{IN}$ 304 from the analog input signals and presents the charge on the input capacitor $C_{IN}$ 304 to the sample-and-hold amplifier 300. The resulting held voltage on capacitor, $C_G$ 302, is presented at OUTMUX, the output of SH1 202.

It should be understood that the MUX 200 and SH1 202 blocks can also be implemented as a purely single-ended multiplexer and sampler, rather than as a differential-to-single-ended converter. However, there are settling and charge switch injection errors that may occur in a purely single-ended implementation. One such single-ended implementation is illustrated in FIG. 4.

OFFSET DAC

The inverting input terminal of the SH1 amplifier 300 receives an analog offset correction signal from the OFFDAC 204. The OFFDAC 204 may be implemented as a charge redistribution DAC with a binary weighted switched capacitor array. The OFFDAC 204 is shown in FIG. 3 with its capacitor switches 306 set to represent an arbitrary binary offset word, which controls the charge (for offset correction) injected into the virtual ground of the op amp 300 at the negative input terminal. This charge appears as a voltage at OUTMUX.

The ADC has been optimized for bipolar operation. The array of the OFFDAC 204 includes a capacitor CBU 308, which is a binary-unipolar conversion capacitor. To maintain the bipolar operation of the ADC, the CBU 308 permits the OUTMUX voltage level to be level shifted when it is known that the input voltage is a unipolar signal. This feature allows the ADC to treat the unipolar signal effectively as a bipolar signal. The reference voltage to the OFFDAC, $V_R$, is provided by a reference voltage buffer 310. The buffer is a standard voltage follower circuit that buffers a high impedance, micropower reference voltage ($V_{REF}$) source (not shown) from settling transients that result from driving the capacitor array 306 with the reference voltage.

The OFFDAC 204 operates as follows. The MUX 200 selects a zero level input voltage. After N bit-clock (BCK) cycles, this zero input voltage is converted to an N-bit digital word by the MAINDAC 208. Ideally, this word should represent a zero level signal. However, because of the cumulative effect of offset voltages provided by various components in the converter, the output word actually represents the cumulative offset voltage of the converter. This N-bit offset correction word is provided from the MAINDAC 208 by the control logic 214 (shown in FIG. 2) to an offset correction word register 312 in the OFFDAC 204 (shown in FIG. 3). This offset correction word governs the state of the capacitor switches 306 in the OFFDAC 204. The resulting analog offset voltage (OFFSET) is provided to the negative input terminal of the SH1 amplifier 300. During a normal sample-and-hold operation, SH1 202 subtracts the offset voltage from the input signal, thereby eliminating the cumulative effects of the offsets found throughout the converter.

It should be noted that the OFFSET correction may be summed into not only SH1 202, but instead into any virtual ground point in the signal path of the front end of the ADC before conversion starts at the MAINDAC 208 and comparator 212 stages, e.g., at the virtual ground of the power gated buffer 206. Further, the OFFDAC 204 eliminates not only offsets generated from within the ADC, but also from other implantable medical device system components that provide inputs to the ADC. For example, measured data concerning pacer parameters, IEGM signals and other inputs that feed into the MUX 200 will also exhibit offsets that can be corrected by the OFFDAC 204 in the ADC. When an input device is set to provide a nominally zero output (e.g., the IEGM is idling), then it too supplies an offset voltage. In that case, the offset correction word represents the cumulative offset voltage not only of the ADC components but of the input device as well. Thus, because of offset correction by the OFFDAC, the design of the non-ADC components may be relaxed with respect to offset correction, thereby reducing the power consumption of the input devices of the implantable medical device as well as the current drain of the ADC circuitry alone.

The use of the global offset correction DAC 204 is superior to the conventional auto-zeroing technique. In the prior art, large capacitances and very high gain op amps were necessary to correct for offsets. Although auto-zeroing is still used by the present invention to correct for low frequency 1/f noise, the ADC of the present invention requires a much smaller capacitance and lower gain op amps than would be necessary for effective offset correction using auto-zeroing alone. As a result, use of the global OFFDAC 204 causes the ADC to drain less power and run faster than an ADC using conventional auto-zero offset correction techniques.

Power Gated Buffer

As mentioned in the background description, the MAINDAC 208 capacitor array requires a relatively high power level to charge the top plates of the array with the input voltage, $V_{ARRAY}$, and the MSB bottom plate of the array with the reference voltage, $V_{REF}$. Although the array in this embodiment may only exhibit a total capacitance of approximately four picofarads, the MAINDAC top plate charging operation draws an excessive amount of current if operated continuously at the current level required for charging.

The ADC of the present invention minimizes the overall power drain using the power gated buffer 206. FIG. 5 is the preferred embodiment of the power gated buffer and consists of a power gated sample-and-hold stage. The buffer isolates the relatively low power, low speed sample-and-hold circuit SH1 202 from the transient effects of the MAINDAC 208 that occur during top plate charging. The front end (shown in FIG. 3) is running at the sampling rate, $f_s$, while the back end (the MAINDAC 208, the comparator 212 and the control logic 214) is running at the bit-clock frequency, BCK. Because of the factor of N difference in speed between the front end and the back end, the front end generally draws much less current than the back end. However, when the front end drives the capacitor array of the MAINDAC 208, the front end sample-and-hold amplifier 300 must settle at the high speed required by the MAINDAC 208. As a result, the front end must operate at a much higher current drain when driving the back end.

To minimize the front end power drain, the power gated buffer 206 generally operates at relatively low power levels, but boosts power appropriately when an analog input voltage must drive the MAINDAC 208 capacitor array. The timing of the power gated buffer 206 will be described with reference to FIG. 6. As will be explained in more detail below, during each one-half bit-clock cycle comprising an acquisition phase "A" 600, the comparator 212 acquires the difference between the voltage $V_{TP}$, found on the top plate of the MAINDAC 208, and the bias voltage $V_B$, found at the other input to the comparator 212. During the next half bit-clock cycle, the comparator 212 enters the latch phase "L" 602 in which the differential input voltage is boosted to logic signal levels and used to update the MAINDAC 208 bottom plate capacitor switch associated with a particular bit of the conversion. Also during the latch phase 602, the next least significant bit is tested by flipping the associated bottom plate switch from ground to a reference voltage (see FIG. 9). The updating of the capacitor switch and the initiation of the testing of the next bit switch causes a new voltage to be created on the top plate of the DAC array. This voltage is acquired during the next acquisition phase.

The MAINDAC 208 capacitor array must be driven with a new analog input voltage sample during the one-half bit-clock cycle 604 before the power gated sample-and-hold buffer circuit 206 begins holding a new analog input sample (at CKIN2), as shown in the timing diagram of FIG. 6. During that one-half bit-clock cycle 604, the capacitor array is isolated from the comparator because the comparator has already latched a capacitor plate voltage needed to determine the least significant bit (LSB) of the binary representation of the previous input. Only during that one-half cycle must the switch STP 210 be closed to drive the MAINDAC 208 capacitor array, and only at that time must the power gated buffer 206 supply the relatively high current necessary to drive the array. Accordingly, the present invention provides a power gated switch 500 in the power gated buffer that is controlled by a power gated clock signal as shown in FIG. 6. Referring back to FIG. 5, the power gated switch 500 switches from a low current source 502 to a high current source 504 only when the power gated clock, PGCK, is high during the determination of the least significant bit of the previous sample. The power gated clock may also control the switching of the top plate switch, STP 210. Alternatively, STP 210 may be controlled by a separate clock, CKTP, as shown in FIG. 6, while PGCK is asserted slightly before the closing of STP 210 to ensure that the power gated buffer 206 has settled into high current mode before being applied to the top plates.

The ability to strobe the power in this manner runs counter to what would be expected in view of the prior art. It would be expected that by varying the current source of a sample-and-hold type buffer, the operating point of the buffer amplifier would change in a nonlinear manner, creating signal distortion. An analysis of the circuit of FIG. 7 illustrates that this is not the case.

Figure 7:
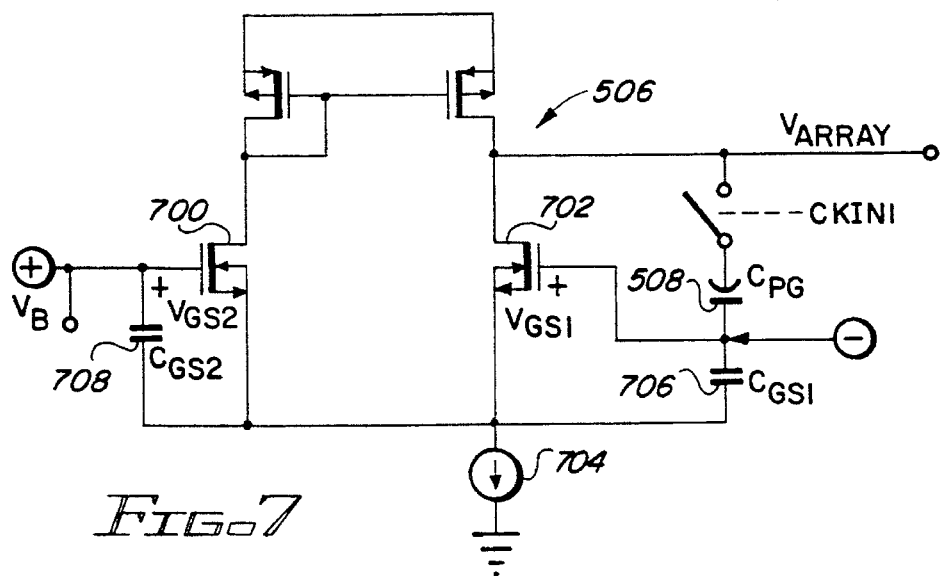
FIG. 7 illustrates an equivalent circuit of the amplifier of the power gated buffer of FIG. 5.

FIG. 7 is an operational transconductance amplifier in a negative feedback configuration that is the equivalent circuit of a power gated amplifier 506 of the buffer 206 of FIG. 5. The amplifier 506 runs at an operating voltage represented by the voltage $V_{GS}$ between the gate and the source of NFETs 700 and 702 of FIG. 7.

Based upon the characteristic curves of the transistors, the voltage $V_{GS}$ is a function of a current I provided by a current source 704. The amplifier 506 also exhibits a device capacitance represented by the two capacitors $C_{GS1}$ 706 and $C_{GS2}$ 708.

Without the presence of the negative feedback provided by a capacitor $C_{PG}$ 508 (also shown in FIG. 5), a change in the current of the current source 704 would change the voltage $V_{GS2}$ of the capacitor $C_{GS2}$ 708, which would create a nonlinear change in the output voltage $V_{ARRAY}$. However, the positive input is tied to $V_B$. Further, the amplifier 506 includes a negative feedback path through the capacitor $C_{PG}$ 508. The negative feedback holds the negative input close to $V_B$ (virtual ground), so that the pertinent nodes are not left floating. Thus, the voltage across $C_{GS1}$ 706 is not a function of the signal input. This is because the negative terminal is constrained to stay very close to $V_B$ due to the negative feedback action and the $V_B$ connected positive input. Consequently, the resulting error voltage is merely a constant offset, which can be negated by the OFFDAC 204. Because the operating point of the power gated buffer 206 can be varied without creating signal distortion, the buffer 206 can "idle" at a low current level until a high current is required to drive the capacitor array of the MAINDAC 208.

As mentioned above, the power gated buffer 206 also isolates the sample-and-hold SH1 202 from transient effects of the MAINDAC 208. Without the power gated buffer 206, if the output OUTMUX of the sample-and-hold 202 (shown in FIG. 2) were to charge the capacitor array of the MAINDAC 208 directly, the resulting settling transient would have undesirable effects both at the output and the input to the sample-and-hold 202, as is well known in the art.

Referring back to FIG. 5, the power gated buffer 206 achieves isolation as follows. During the second clock phase when CKIN2 is high, an input gating switch 510 is closed to allow the gated buffer 506 to receive the OUTMUX signal and charge the gating capacitor $C_{PG}$ 508. At this time, the array top plate switch, STP 210, is open to isolate the power gated buffer 206 from the MAINDAC 208. During the clock phase CKIN1, a first feedback switch 512 closes, while a second feedback switch 514 and the input gating switch 510 open to permit the charge on the gating capacitor $C_{PG}$ 508 to be presented to the output of the buffer 506 as $V_{ARRAY}$. The opening of the input gating switch 510 isolates the front end block from any settling transients that may back up through the power gated buffer 206 when the buffer output is connected to the MAINDAC 208 capacitor array. Thus, the power gated buffer 206 achieves perfect isolation of the front end from the MAINDAC 208.

Figure 8:
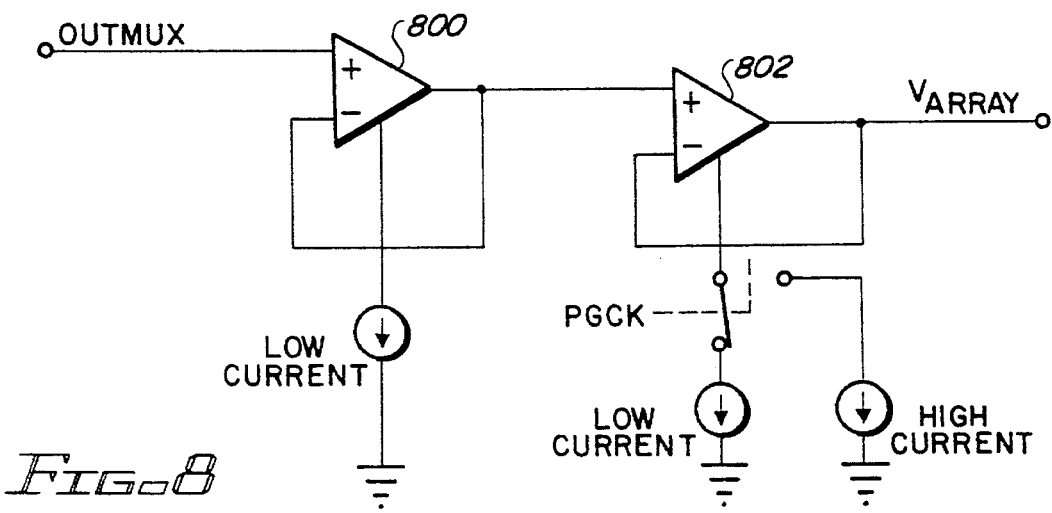
FIG. 8 illustrates an alternative embodiment of the power gated buffer of the present invention.

An alternative embodiment of the power gated buffer 206 is illustrated in FIG. 8. This embodiment includes a first buffer amplifier 800 and a second buffer amplifier 802. The second buffer amplifier 802 switches from low current to high current based upon the state of the power gating clock PGCK. However, this implementation is a continuous time, rather than discrete time, power gated buffer. Because it does not employ an input switch to isolate the input to the power gated buffer from the transient effects of the MAINDAC 208 array, the power gated buffer of this embodiment must include the first buffer 800, which continuously operates at low current.

MAINDAC

FIG. 9 illustrates the MAINDAC 208 of the present invention, including a binary weighted, switched capacitor array 900, a MAINDAC latch 902, and a reference voltage buffer 904. The array 900 includes a most significant bit capacitor (MSB) 906 and bottom plate switches 913. In contrast to the conventional ADC, the present invention introduces the analog input voltage to the top, and not the bottom, plates of the switched capacitor array.

A significant advantage of top plate charging over bottom plate charging is that no extra phase is necessary to shift the input potential from the bottom plate to the top plate in order to initiate conversion.

To charge the top plates of the capacitor array 900, the switch STP 210 is closed (as shown in the timing diagram of FIG. 6) and the power gated buffer 206 provides a high power $V_{ARRAY}$ signal (refer to FIGS. 5 and 6).

During the charging of the array, a high power version of the reference voltage $V_{REF}$ is provided as a signal $V_{RM}$ by the power gated reference voltage buffer 904, which is also power gated, as shown in FIG. 9. The reference buffer 904 operates in a manner similar to that of the power gated buffer 206. This high power version of $V_{REF}$ is used to charge the bottom plate of an MSB capacitor 906 to $V_{REF}$ while the top plate of the array is charged to $V_{IN}$. The bottom plates of the remaining capacitors in the array 900 are charged to ground. This starts the DAC array at mid-scale to effect a bipolar conversion.

The DAC capacitor array shown in FIG. 9 is a split capacitor array, as is known in the art. Split arrays trade capacitor matching accuracy for a reduction in total capacitance. As a result of a horizontal splitting capacitor $C_s$ 909, the corresponding node $V_{SP}$ 911 has no D.C. path to ground. To avoid an undesirable D.C. voltage at VSP, which might cause leakage problems, a grounding switch 907 (that is controlled by CKTP) resets the voltage of $V_{SP}$ to ground during CKTP.

At time CKIN2 (see FIG. 6), the top plate switch STP 210 is opened to isolate the MAINDAC array 900 from the analog input signal, and to allow the MAINDAC 208 to calculate the N-bit binary representation of the input signal $V_{IN}$.

In contrast to the ADC of the prior art which is charged at the bottom plates, when the top plate switch STP 210 is opened in the ADC of the present invention, the analog input voltage is immediately available on the top plate for acquisition by the comparator 212. During the one-half bit-clock cycle comprising an acquisition phase 600, the comparator 212 acquires the difference between the top plate voltage $V_{TP}$ and the bias voltage $V_B$. In one embodiment, the bias voltage is selected to lie in the middle of the desired full scale input range of the ADC. Note that because of the offset correction the exact value of $V_B$ is not critical.

During the one-half bit-clock cycle comprising a comparator latch phase 602, the comparator 212 updates the bit being tested based on the comparison between the comparator input voltages, i.e., the comparator 212 sets the bit to zero or one, and the control logic 214 initiates the testing of the next least significant bit by switching the bottom plate switch 908 of the next bit capacitor from ground to the reference voltage.

During the next acquisition phase, the comparator 212 acquires the new top plate voltage that resulted from updating the last bit and flipping the next bit switch 908. During the latch phase, the comparator 212 updates the bit corresponding to the capacitor being tested, while at the same time the control logic 214 flips the bottom plate switch 908 of the next least significant bit capacitor from ground to reference. This process continues until all bottom plate switches have been tested and set. After the process is completed, the state of the bottom plate switches 908 ($DO_1$ $(MSB)$, ....., $DO_{N(LSB)}$) represent the N-bit binary version of the input voltage.

Note that when the LSB (Nth bit) is being updated during the latch phase, there is no next LSB to be tested. The full N-bit representation of the analog input has been generated. Thus, at that time, the top plates of the MAINDAC array 900 can be driven with a new analog input value $V_{ARRAY}$ by closing STP 210 and raising the power gated clock PGCK high, as shown in FIG. 6.

As described in the background, the use of top plate sampling runs counter to conventional wisdom. However, laboratory testing of the ADC of the present invention (running on the order of one kilosample per second and performing eight-bit conversions) has demonstrated that the resulting hold pedestal error due to the channel charge injection of the top plate switch has a negligible effect on the final digitized output. Assuming a four $p_F$ total top plate array capacitance and a minimum switch size, there will be approximately a one LSB pedestal error. Of this one LSB pedestal error, 0.1 LSB is gain error, 0.03 LSB is distortion and approximately 0.9 LSB is offset error. The offset error is removed by the OFFDAC 204. Thus, the linearity of this technique can be extended to twelve bits.

The present invention also saves one-half cycle of conversion time by starting the conversion process in bipolar mode. That is, the bottom plate switch 913 of the MSB capacitor 906 is set to the reference voltage, while the remaining switches 908 are set to ground. The advantage of this starting configuration is highlighted by comparing it to the initial operations of a unipolar converter. In any successive approximation ADC, the digital representation is arrived at by following a binary decision tree of comparisons. Any binary decision tree must start in the middle of the input range. To accomplish this function in a unipolar converter, the MSB capacitor 906 bottom plate switch 908 must first be flipped to the reference voltage, and the resulting top plate voltage compared to $V_B$ to determine whether the MSB switch is to remain set at $V_{REF}$ or reset to ground. As a consequence, unipolar conversion unnecessarily wastes one-half of a bit-clock (BCK) cycle.

In contrast, by initiating conversion in bipolar mode, the MSB bottom plate switch need not be flipped, and the comparator 212 may immediately compare the top plate voltage with the bias voltage to determine the correct state of the MSB switch. In sum, bipolar conversion avoids the need to flip the MSB switch unnecessarily, while the use of top plate charging avoids the need to redistribute the input voltage charge from the bottom plate to the top plate. The combined effect saves one-half of a bit-clock cycle time, resulting in faster performance over conventional ADCs.

The ADC also enhances settling speed by the manner in which the capacitor bottom plate switches 908 are set and maintained in the MAINDAC latch 902. The MAINDAC latch 902 of the present invention is comprised of transparent D latches, such that when a gating (G) line 910 goes high, its associated data output (DO) 912 is transparent to its associated data input (D) 914. For example, if $G_N$ is high then $D_N$ appears at $DO_N$ transparently. When $G_N$ goes low, then the corresponding D latch latches the level of $DO_N$ just before $G_N$ goes low. The gating signals are provided by the ADC logic of FIG. 14, which times the gating signals to allow successive bit-by-bit updates every bit-clock cycle.

The advantage of using transparent D latches is that they allow the MAINDAC 208 to be updated as soon as possible. In conventional ADCs, the settling of the DAC in response to a comparator update and the comparator acquisition of a new input must occur together in one-half of a bit-clock cycle. The other half cycle is dedicated to the latching operation (amplifying the acquired signal to logic levels to provide the update).

This method is not optimal in the case of the present invention in which the comparator latching speed is much faster than the acquisition speed (as demonstrated below). Using an entire one-half bit-clock cycle to perform the latching operation would waste much of that time period. Here, because of the high speed features of the comparator latch of the present invention, in one embodiment the latch can accomplish the latching function within approximately ten microseconds, leaving approximately fifty microseconds during the latch phase in which other functions may be accomplished (one-half of a bit-clock cycle at one kilosample per second for an eight bit conversion is approximately sixty microseconds).

The present invention uses this excess fifty microseconds to (1) asynchronously update the MAINDAC bit based upon the comparator latch result, and (2) initiate the next MAINDAC bit test by flipping the bottom plate switch of the next LSB capacitor to the reference voltage. This leaves the acquisition phase free to acquire the next DAC array top plate sample without waiting for the top plate voltage to settle as a result of the new state of the bottom plate switches.

To achieve this result, the MAINDAC latch 902 updates the bottom plate switches 908 asynchronously with respect to the bit-clock BCK. The gating logic signal ($G_i$, i=1(MSB), ..., N(LSB)) for the particular bit being updated is kept high during the latch phase so that the update $D_i$ may be passed from the comparator through the corresponding transparent latch to the appropriate capacitor switch as soon as the comparator result has been latched. This allows the DAC top plate to settle in response to the update and the new bit test before acquisition begins. By decoupling the settling time of the DAC from the comparator acquisition time, the present invention exhibits a significant increase in conversion speed over what would be expected from conventional micropower ADCs.

Comparator

FIG. 10 is a block diagram illustrating the comparator 212 of the present invention. The comparator includes a buffer 1000, a wide band preamplifier (preamp) 1002, a differential latch 1004, and a clocked precharged latch 1006, followed by a comparator detection logic circuit 1008. In one embodiment, the precharged latch 1006 comprises four cascaded precharged static memory cells (PSMCs). The comparator detection logic 1008 detects when the PSMCs have produced a valid full logic level output signal. It may be implemented as an exclusive OR gate.

FIG. 11 is a circuit level diagram of the comparator 212 of FIG. 10. The comparator detection logic 1008 and all but the first precharged static memory cell (PSMC1) 1100 have been omitted from FIG. 11 to avoid unnecessarily complicating the figure. The comparator buffer 1000 is implemented as a highly linear source follower exhibiting a very low input capacitance in order to permit a quick and accurate response to large voltage swings on the top plate of the capacitor array. Note that the buffer circuit 1000 is not fully balanced in order to save power.

The preamp 1002 is a wide band differential preamp that compares the top plate input signal voltage $V_{TP}$ against the bias voltage $V_B$ to produce a balanced differential output signal at OUTP and OUTM. In this embodiment, the preamp 1002 uses cross-coupled, current starved FET diode loads to attain a gain of approximately eight.

During the acquisition phase, the preamp 1002 acquires the differential input ($V_{TP}$–$V_B$), amplifies it and presents a balanced differential signal to the latch stage 1004 of the comparator. During the latch phase, the latch 1004 raises the balanced differential signal to logic levels. During the latch phase, one of the latch switches (S2) 1102 is open, essentially isolating the preamp outputs OUTP and OUTM from a pair of gate inputs to PFETS P1 1104 and P1A 1106 of the latch stage 1004.

The present invention takes advantage of the latch time in which the preamp 1002 would otherwise lay idle to utilize the preamp for constructive purposes. Due to the inherent properties of the MOSFETs comprising the preamp 1002, it takes a given amount of time for the preamp 1002 to respond to a change in samples from one acquisition phase to the next. For example, the preamp 1002 can quickly respond to a small change in voltage level from sample to sample. Moreover, if the preamp 1002 were driven to saturation during one acquisition phase, and then driven with a large signal of opposite polarity during the next acquisition phase, the preamp would also rapidly respond. In contrast, it is known that subsequently driving a circuit like the preamp 1002 out of saturation with a small signal is the worst case in terms of the time it would take for the preamp to respond.

Taking these facts into account, the present invention introduces an input shorting switch S1 1108, which is tied to the bias voltage $V_B$ during the latch phase. This action forces the differential input to the preamp 1002 to zero, thereby creating a zero differential output during latch. By switching the preamp differential input back to zero during the latch phase, the present invention effectively eliminates the possibility of the worst case scenario. By closing S1 1108 during the latch phase, a small signal input acquired during one acquisition phase will never have to drive the preamp 1002 out of saturation caused by a previously acquired input. Consequently, the use of S1 1108 places the preamp 1002 at an operating point from which it can rapidly respond to changes in acquired samples.

As mentioned above, the differential latch 1004 amplifies the output of the preamp 1002 to a logic level, such as three volts. Such a latch is typically followed by a standard CMOS inverter. That configuration would be acceptable if the ADC were operating at a relatively high power level. However, the ADC of the present invention is designed to operate at micropower levels, typically on the order of a few hundred nanoamps. As a result, the logic level outputs of the latch 1004 will exhibit a slow slew rate, i.e., the rise and fall times of the latch output logic signal will be relatively long. As is known in the art, when signals with slow slew rates are input to a CMOS inverter (as is typically done), the inverter will exhibit high crossover currents, causing tremendous current spikes that will present an unacceptable drain on battery power. Crossover current exists for most static inverter designs. The problem is that, due to the low slew rate input signals to the inverter, the crossover current persists for a significant portion of a bit-clock cycle. This leads to excessive average current drain. At the very low power levels required by the micropower ADC of the present invention, the power drain caused by a standard comparator would thus render a micropower ADC unfeasible.

To overcome the crossover current problem, the present invention uses a series of precharged static memory cells (PSMCs), which effectively achieve very fast slew rates so as to square off the digital output of the latch. Each PSMC is precharged so as to respond almost immediately to a small differential input. In the preferred embodiment, four PSMCs are cascaded to guarantee that the edges of the output signal are at normal logic speed to avoid any chance of crossover current.

The detailed operations of the latch 1004, the PSMC cells (such as PSMC1 1100) and the comparator 212 are explained with reference to FIG. 11 (in which switches are shown in the comparator acquisition phase). All such switches are clocked at the bit-clock (BCK) rate, and the switch positions are controlled by a comparator clock signal (VL) from a master clock generator (shown in FIG. 14, described below). A timing diagram of VL and the comparator switches is shown in FIG. 6. Although not readily apparent from FIG. 6, VL is a slightly delayed version of the bit-clock.

To reiterate, during acquisition, the top plate voltage $V_{TP}$, is fed to the preamp stage 1002 through the source follower buffer 1000 and the input shorting switch S1 1108. The source follower buffer 1000 prevents the top plates of the MAINDAC array 900 from being affected by the input capacitance of the preamp 1002, and allows the use of the switch S1 1108 to improve the speed of the preamp 1002, as discussed earlier. The preamp 1002 also receives the bias voltage, $V_B$, and provides a wide band, differential balanced output at OUTP and OUTM.

The latch 1004 acts as a differential gain stage receiving the differential preamp outputs, OUTP and OUTM, at the PFET P1A 1106 and P1 1104, respectively. During acquisition, the PFETs P1 1104 and P1A 1106 and NFETs N1 1110 and N1A 1112 are on because switches S2 1102 and S4 1114 are closed. Conversely, because switch S5 1116 is open, NFETs N2 1118 and N2A 1120 are turned off. In the acquisition mode, the latch 1004 acts as a current mirror with a current I+ flowing through the transistor N1A 1112 and a current I– flowing through the transistor N1 1110.

During acquisition, the PSMC1 1100 is off because a switch SB 1122 is open, so that a pair of NFETs N3 1124 and N3A 1126 are also off. Because a pair of switches SA 1128 of the PSMC1 1100 are closed, both the outputs Q1 and Q1B of the PSMC1 1100 are tied to $V_{DD}$, so that a pair of PFETs P2 1130 and P2A 1132 also do not conduct during acquisition.

During the latch phase of operation, the switches S2 1102 and S4 1114 are opened, and switches S3 1134 and S5 1116 are closed. This switching configuration causes currents $I_B$ and $I_{BA}$ to flow through the transistors N2 118 and N2A 1120, respectively. The transistors N1 110 and N1A 1112 are off because the switch S4 1114 is open. Similarly, the switch S2 1102 being open turns off the PFETs P1 1104 and P1A 1106, which isolates the preamp resetting transients (due to S1) from affecting the latch results. In this latch configuration, the latch 1004 acts as a cross-coupled positive feedback amplifier so that the difference between OUTP and OUTM at the input of the latch 1004 is differentially amplified to logic levels.

In a fashion similar to that of the switch S1 1108 in the preamp 1002, a shorting switch S6 1136 in the latch 1004 improves the acquisition speed of the positive feedback latch stage. At the end of the latch phase the outputs LM and LP of the latch stage are at logic 0 and logic 1 (which are VSS and VDD). When the latch 1004 switches back into the acquisition phase the positive feedback is disabled and the output of the preamp stage 1002 is applied to the latch stage inputs at 1104 and 1106. Because the latch operates at very low current levels, for very small preamp differential output signals the latch outputs must return to a near-zero differential output level. However, this requires the latch outputs LM and LP to slew and settle relatively quickly (from VDD and VSS) using very low current levels. This could degrade the acquisition speed of the comparator 212, which in turn reduces the speed of the ADC. To avoid this problem, a differential shorting switch, S6 1136, is provided across the differential latch outputs LM and LP. During the first 100–200 nsec of the acquisition phase, the switch S6 1136 is closed, thereby balancing the latch outputs and greatly reducing acquisition time. Note that the switch S6 1136 cannot remain closed during the entire acquisition phase (as it is sometimes used in higher power comparator designs) due to the micropower operating levels of the latch 1004. The reason the switch cannot remain closed is that the switch impedance is as much as one hundred times less than the load impedance of the internal latch amplifiers (diode-connected NFETs N1A 1112 and N1 1110), which means that keeping the switch S6 1136 closed would destroy any acquisition gain and greatly reduce comparator speed.

In summary, during the acquisition phase, the preamp 1002 amplifies the difference between the top plate voltage, $V_{TP}$, and the bias voltage, $V_B$, to produce a balanced differential medium gain output at OUTP and OUTM. During the latch phase, the latch 1004 acts as an infinite gain, positive feedback amplifier to raise the differential preamp signal to logic levels.

The speed of the comparator 212 is critical to determining the overall speed of the analog-to-digital converter. When operating at the micropower levels of the present invention, attaining a fast comparator output is especially difficult because of the slow slew rate signals provided by the current starved latch. The precharged static memory cells (PSMC's) of the present invention are used to speed up the comparison process and to avoid unacceptable crossover currents.

During the acquisition phase, the nodes Q1 and Q1B of PSMC1 1100, which are the gates of the PFETs P2 1130 and P2A 1132, respectively, are precharged to the supply voltage $V_{DD}$. The sources of the PFETs P2 1130 and P2A 1132 are also tied to VDD, meaning that the transistors P2 1130 and P2A 1132 are turned off because the gate-source potential across those transistors is zero. Thus, during acquisition, those transistors are precharged yet conduct no current.

During latch, the switches SA 1128 are opened and the switch SB 1122 is closed. Each PSMC PFET gate is then controlled by the drain of its mirrored opposite PFET (i.e., P2 1130 and P2A 1132 are cross-coupled). That is, node Q1 controls the gate of transistor P2 1130, and node Q1B controls the gate of transistor P2A 1132. These nodes, in turn, are controlled by the NFETs N3A 1126 and N3 1124, respectively, which themselves are controlled by the latch outputs LM and LP, respectively.

During the acquisition phase of operation, the common mode voltage of the differential latch outputs LM and LP reside at approximately one FET threshold voltage above $V_{ss}$. This occurs because the latch devices are biased in the low current weak inversion region. Thus, at the transition from acquisition to latch, N3 1124 and N3A 1126 in the PSMC 1100 conduct only weak inversion current (nanoamperes). Assume at the start of latch, for example, that LP starts moving toward high ($V_{DD}$) and LM starts moving toward low ($V_{ss}$), i.e., $V_{TP} > V_B$ in this example. Within the first 100 mV of the differential latch output (LP-LM) N3A 1126 will go from being biased in weak inversion to being off. This happens in the first two microseconds of the latch phase.

During this initial two usec of the latch phase, the transistor P2 1130 is off due to the precharging that occurred during comparator acquisition. The only way that the PFET P2 1130 can turn on during this brief time is for the node Q1 to pull down from its precharged value of $V_{DD}$ to one threshold voltage below $V_{DD}$. This would require a current too large to be delivered by the extremely low current of the N3A FET 1126 in the weak inversion state. Thus, while the NFET N3A 1126 is turning off, the PFET P2 1130 stays off, thereby avoiding crossover current in this path. Because the PFET P2 1130 is off, then while LP is moving toward $V_{DD}$, the NFET N3 1124 pulls down Q1B but conducts no crossover current. As Q1B pulls down it turns on the PFET P2A 1132, which pulls Q1 back toward $V_{DD}$ (if any drop caused by the transistor N3A 1126 occurred during the first two usec of the latch phase), thereby guaranteeing that the PFET P2 1130 stays off.

It is clear from the above description of the PSMC operation that the PSMC 1100 takes full advantage of the fact that its signal input levels reside close to a given supply voltage at the transition from the acquisition to the latch phase of operation. Thus, because LM and LP reside near $V_{ss}$ at the beginning of latch, the input devices of the PSMC1 1100 are the NFETs 1124 and 1126 having sources connected to the $V_{ss}$ supply voltage during latch. The overall result of implementing this PSMC circuit is that crossover currents are avoided.

The PSMCs are cascaded by connecting the Q1 and Q1B outputs of one PSMC to the FET gate inputs of the next PSMC. For example, FIG. 12 illustrates a second PSMC, PSMC2 1200, which is driven by the PSMC1 1100. The PSMC2 1200 is a mirrored version of the PSMC1 1100 (mirrored around the Q1-Q1B axis), which implements the PFETs P2 1130 and P2A 1132 of PSMC1 1100 as input devices having sources that are switched to $V_{DD}$ during latch. Note that the inputs of PSMC1 1100 are NFETs while those of PSMC2 1200 are PFETs. Thus, PSMCs with alternating types of input devices (PFETs and NFETs) may be cascaded together to increase the speed of any low slew rate signal until the output slew rate is sufficient to drive a standard static logic gate without creating excessive crossover current. Note that because of the symmetry of the circuit, the entire comparator 212 may alternatively be designed as a mirrored version of FIG. 11 around the horizontal center axis, wherein the differential latch outputs would initially reside near $V_{DD}$ instead of $V_{ss}$ during the start of the latch phase. Similarly, the first PSMC would be precharged to $V_{ss}$, instead of $V_{DD}$, at that time.

In this embodiment, after cascading four PSMCs, the slew rate improves from approximately one volt in ten microseconds to about one volt in three nanoseconds. This is a tremendous improvement in the slew rate, allowing a micropower input to achieve logic levels rapidly with very low current dissipation.

Figure 13:
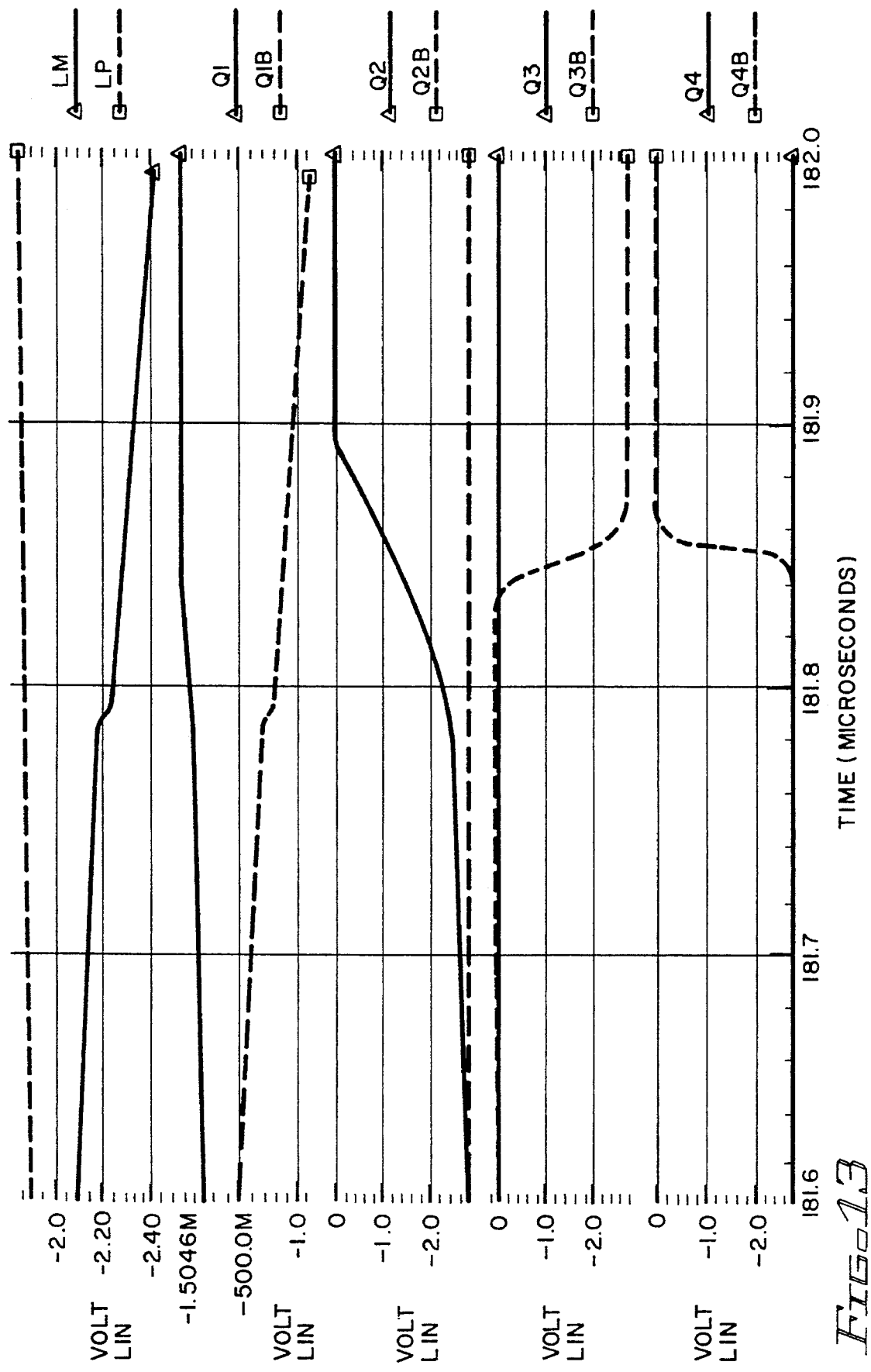
FIG. 13 is a series of graphs illustrating the performance of a simulation of the present invention.

The overall effect of using the performance enhancement techniques of the input shorting switch S1 1108 and the cascaded precharged static memory cells 1006 is shown in FIG. 13, which is a series of graphs produced by a SPICE (Simulation Program with Integrated Circuit Emphasis) simulation of the present invention. The top graph shows the differential output of the latch exhibiting a very slow slew rate. The four succeeding graphs illustrate the outputs of four successive precharged static memory cells having differential outputs (Qi, QiB, i=1, 2, 3, 4). The bottom graph is the output of the fourth PSMC in the cascade, exhibiting an extremely fast slew rate of 2.83 volts in approximately ten nanoseconds.

Control Logic

FIG. 14 illustrates the control logic 214 of the present invention. Using SCK and BCKIN input clock signals (which are respectively a sample rate clock and bit rate clock (not shown)), a master clock generator 1400 generates the sampling frequency clock signal $f_s$, the bit-clock signal BCK=$Nf_s$, and the power gated clock signal PGCK (as shown in FIG. 6). The master clock generator 1400 also generates the signal CKTP to control the top plate switch STP 210 and the grounding switch 907 of the splitter node, $V_{SP}$ 911 (as shown in FIG. 9). The master clock generator 1400 further generates the front end switch control signals CKIN1 and CKIN2 (as shown in FIGS. 3 and 6). Finally, the master clock generator 1400 generates the comparator logic clock signal VL that controls the internal comparator switches.

A sequencer 1402 provides outputs $S_1, \ldots, S_N$ that designate the bit being determined during the conversion. Based on these signals, a DAC control logic circuit 1404 provides the data signals 914 $D_{1\ (MSB)}, \ldots, D_{N\ (LSB)}$, and the gating signals 910 $G_{1\ (MSB)}, \ldots, G_{N\ (LSB)}$ for the appropriate bits. The data signals are sequentially set to one or zero depending upon the output QOUT of the comparator 212. The gating signals are high during the latch phase to allow the data signals to control the transparent D latches in the main DAC latch (shown in FIG. 9). The sequencer 1402 also provides a reset signal to indicate an end of conversion, i.e., that all DAC bits have been determined for a particular input, and to signal the start of the next conversion cycle. Based upon the timing diagrams, the figures and the text of this disclosure, one skilled in the art would be able to design the control logic 214 of the present invention to achieve the functionality described in the specification.

Although the present invention has been described in terms of various embodiments, it will be appreciated that various modifications and alterations might be made by those skilled in the art without departing from the spirit and scope of the invention. In particular, it is to be understood with no loss of generality that the present invention as described in this disclosure could easily be extended not only to the operational transconductance amplifiers described herein, but to any type of single stage op amp, such as a folded cascode or a current mirroring cascode. The invention should, therefore, be measured in terms of the claims which follow.

What is claimed is:

1. A micropower comparator for use in an implantable medical device, the comparator for receiving a first analog input signal and a second analog input signal, the comparator comprising:

a synchronous high gain amplifier for differencing the first and second analog input signals to thereby provide a balanced amplified difference signal during an acquisition phase, and for amplifying the difference signal to a logic level during a latch phase to thereby produce a differential latch output signal, wherein the differential latch output signal has a slew rate and the logic level has either a high logic level voltage or a low logic level voltage;

at least one precharged static memory cell (PSMC) for increasing the slew rate of the differential latch output signal without drawing crossover current, the at least one PSMC having a pair of differential outputs for providing a differential PSMC output signal, whereby current drain of the implantable medical device is substantially reduced; and a comparator detection logic circuit for providing a comparator logic level output upon detecting that the differential PSMC output signal has reached the logic level, the comparator logic level output representing the amplified difference of the first and second analog input signals.

2. The comparator of claim 1, the at least one precharged static memory cell further comprising:

a pair of differential inputs for receiving a differential input signal, the differential inputs of a first precharged static memory cell for receiving the differential latch output signal as the differential input signal, wherein during the acquisition phase,
the differential PSMC outputs are both statically precharged to the same logic level voltage; and
the PSMC is turned off; and during the latch phase,
the PSMC is turned on; and
the PSMC amplifies the differential input signal to the logic level to thereby produce the PSMC differential output signal, whereby the amplification of the differential input signal results in the differential output signal having a higher slew rate than the differential input signal so as to substantially reduce crossover currents in subsequent logic stages.

3. The comparator of claim 2, the at least one PSMC comprising a dynamic precharged inverting amplifier having a pair of crosscoupled load transistors, each load transistor lying in a corresponding current path, each PSMC output being coupled to a corresponding current path and to the gate of the crosscoupled load transistor in an opposite current path, wherein during the acquisition phase, the load transistors are statically precharged in an off condition, so that the load transistors do not conduct current; and during the latch phase, one of the load transistors is turned on in response to the differential input signal, and a resulting current flow in the current path of the on transistor forces the crosscoupled load transistor in the opposite current path to remain off, thereby avoiding crossover currents in the PSMC.

4. The comparator of claim 2, wherein the differential outputs of the first PSMC are coupled to the differential inputs of a second PSMC, and the differential outputs of the second PSMC are coupled to the comparator detection logic circuit.

5. The comparator of claim 2 wherein the at least one PSMC comprises a plurality of cascaded PSMCs including a last PSMC having differential outputs coupled to the comparator detection logic circuit.

6. The comparator of claim 1, the implantable medical device including a successive approximation analog-to-digital converter (ADC) for converting a device analog input signal to a digital output signal, the device analog input signal representing a biophysical characteristic measured by the implantable medical device or an electrical characteristic of the implantable medical device itself, the ADC having a binary weighted, switched capacitor array digital-to-analog converter (DAC) for providing a DAC analog output signal in response to capacitor switch positions of the array, each switch position representing a bit of the ADC digital output signal, wherein the first analog input signal of the comparator is the DAC analog output signal, the second analog input signal of the comparator is a bias voltage, and the bits of the ADC digital output signal are successively determined in response to the comparator logic level output signal.

7. The comparator of claim 1, the synchronous high gain amplifier including an open loop differential preamplifier having a first differential preamp input and a second differential preamp input, wherein during the acquisition phase, the first differential preamp input is coupled to the first analog input signal, during the latch phase, the first differential preamp input is coupled to the second analog input signal, during both the acquisition and latch phases, the second differential preamp input is coupled to the second analog input signal, whereby the preamplifier is placed in an operating point at the start of each acquisition phase from which it can rapidly respond to changes in the first and second analog input signals.

8. The comparator of claim 1, the synchronous high gain amplifier including a latch circuit that comprises a positive feedback crosscoupled inverting amplifier, wherein the latch circuit has a pair of differential latch outputs for providing the differential latch output signal, and the differential latch outputs are shorted together during a portion of the acquisition phase at the start of the acquisition phase, whereby the latch circuit is placed in an operating point at the start of each acquisition phase from which it can rapidly respond to changes in the first and second analog inputs as reflected in the balanced amplified difference signal acquired from the preamplifier.

9. In a micropower successive approximation analog-to-digital converter (ADC) for converting an analog input signal into an N-bit digital output signal, the analog input signal representing a biophysical characteristic measured by an implantable medical device or an electrical characteristic of the implantable medical device itself, the ADC including a front end and a back end, the front end having sampling circuitry operating at a low frequency and at a low power for generating a sampled analog input signal, the back end having conversion circuitry operating at a high frequency and at a high power for determining the N-bit digital output signal that represents the sampled analog input signal, a power gated buffer comprising:

a switched buffer amplifier having an input for receiving the sampled analog input signal from the sampling circuitry and for providing a buffered output signal representing the sampled analog input signal; and a power gating switch for switching an operating power level of the switched buffer amplifier from a low operating level during a first phase to a high operating level during a second phase to thereby provide a power gated buffered output signal, wherein the power gated buffered output signal is provided during the second phase to the back end of the ADC before the back end begins determining a most significant bit of the digital output signal, whereby limiting the operating power level in this manner substantially reduces power requirements of the ADC.

10. The power gated buffer of claim 9, the conversion circuitry of the back end including a digital-to-analog converter (DAC) coupled to a comparator, the DAC being a binary-weighted switched capacitor array having top plates and bottom plates, wherein the power gated buffer provides the power gated signal to charge the top plates of the DAC capacitor array during the second phase.

11. The power gated buffer of claim 10, further comprising:

a reference buffer amplifier for receiving a reference voltage and for providing a buffered reference voltage representing the reference voltage;

a reference buffer power gating switch for switching an operating power level of the reference buffer amplifier from a low reference buffer operating level during the first phase to a high reference buffer operating level during the second phase to provide a power gated buffered reference voltage to the bottom plates of the DAC capacitor array during the second phase.

12. The power gated buffer of claim 9, wherein the low frequency is a sampling frequency, $f_s$, of the sampling circuitry, and the high frequency is a bit-clock frequency, $BCK=Nf_s$, of the back end, the second phase having a duration of one-half of a bit-clock cycle in which a least significant bit of the digital output signal of a previous analog input signal is determined by the back end of the ADC.

13. The power gated buffer of claim 9, further comprising an input gating switch coupled to the input of the switched buffer amplifier for coupling the sampled analog input signal to the input of the switched buffer amplifier during the first phase.

14. The power gated buffer of claim 9, further comprising an input buffer amplifier for buffering the sampled analog input signal from the front end of the ADC to the input of the switched buffer amplifier, wherein the input buffer amplifier operates at a low operating power level.

15. The power gated buffer of claim 9, further comprising an output gating switch for coupling the power gated signal to the back end of the ADC during the second phase.

16. A successive approximation, micropower analog-to-digital converter (ADC) for converting an analog input voltage, the ADC including sampling circuitry for generating a sampled analog input signal, the ADC comprising:

means for generating a reference voltage, a bias voltage, and a ground voltage;

a digital-to-analog converter (DAC) having a plurality of capacitors configured to produce a plurality of binary-weighted DAC analog output signals, each capacitor being coupled through a capacitor switch, wherein each capacitor switch position corresponds to respective bits of an ADC digital output signal, the DAC further including means for producing a plurality of net capacitor voltages corresponding to the difference between the sampled analog input signal and a respective one of the plurality of DAC analog output signals, each net capacitor voltage having a prescribed settling time associated therewith; and a comparator, having an acquisition phase and a latch phase, for determining the capacitor switch positions, the comparator including:

means for successively comparing each net capacitor voltage to the bias voltage during a respective acquisition phase to produce a difference signal;

conversion means for converting the difference signal to a logic level bit decision during a portion of a respective latch phase; and means for asynchronously updating the ADC digital output signal and for asynchronously updating a next net capacitor voltage as soon as a bit decision results;

whereby the next net capacitor voltage starts to settle within a remaining portion of the latch phase;

whereby utilization of the remaining portion of the latch phase results in a reduction in required acquisition phase duration and a corresponding decrease in power requirements.

17. The analog-to-digital converter (ADC) of claim 16, wherein:

the plurality of capacitors each include a top plate and a bottom plate, the capacitor switches being coupled to a bottom plate of a respective one of the plurality of capacitors; and the means for producing a plurality of net capacitor voltages further includes a top plate switch for coupling the plurality of top plates to the sampled analog input signal, the plurality of top plates being coupled to the comparator;

whereby the sampled analog input voltage is immediately available on the top plates for acquisition by the comparator.

18. The analog-to-digital converter (ADC) of claim 17, the ADC having means for correcting an input-referred offset voltage, the offset correcting means comprising:

means for setting to zero at least one input in the signal path prior to the ADC to produce an analog offset signal;

means for converting the analog offset signal to a offset correction word representing the global input-referred offset voltage; and an offset digital-to analog converter (OFFDAC) having means for converting the offset correction word to an offset correction voltage, wherein the offset correction voltage is coupled into the at least one input in the signal path of the ADC.

19. The analog-to-digital converter (ADC) of claim 18, wherein the OFFDAC comprises a binary-weighted charge redistribution capacitor array.

20. The analog-to-digital converter (ADC) of claim 17, wherein the means for producing a plurality of net capacitor voltages further comprises:

means for defining a charging phase coincident with a latch phase in which a least significant bit (LSB) of the ADC digital output signal of a previous analog input signal is determined such that the bit determined in a next latch phase is a most significant bit (MSB) of the ADC digital output signal for a next sampled analog input signal; and means for presetting, during the charging phase, the capacitor switch position corresponding to the most significant bit (MSB) to the reference voltage so that the ADC performs bipolar conversion starting at a midrange digital output signal value;

whereby ADC conversion time and power requirements are reduced because no charge redistribution phase to transfer the sampled analog input signal from the bottom plate to the top plate is required for determining the MSB.

21. The analog-to-digital converter (ADC) of claim 17, the sampling circuitry operating at a low frequency and at a low power level, the D/A converter operating at a high frequency and at a high power level, the ADC having a power gated buffer comprising:

means for defining a charging phase coincident with a latch phase in which a least significant bit (LSB) of the ADC digital output signal of a previous analog input signal is determined such that the bit determined in a next latch phase is a most significant bit (MSB) of the ADC digital output signal for a next sampled analog input signal;

a switched buffer amplifier having an input for receiving the sampled analog input signal and for providing a buffered output signal thereof; and a power gating switch for switching an operating power level of the switched buffer amplifier from the low power level to the high power level during the charging phase to thereby provide a power gated buffered output signal, wherein the power gated buffered output signal is provided before the most significant bit (MSB) of the digital output signal is determined;

whereby limiting the operating power level in this manner substantially reduces power requirements of the ADC.

22. In a successive approximation, micropower analog-to-digital converter (ADC) for converting an analog input signal, the ADC including sampling circuitry for generating a sampled analog input signal, the ADC further including a digital-to-analog converter (DAC) and a comparator, the DAC including a plurality of binary-weighted capacitors configured in a parallel circuit arrangement, each capacitor being coupled through a switch to one of a reference or a ground voltage, the switch positions being determined by the comparator, wherein each switch position corresponds to respective bits of an ADC digital output signal, a method for converting the analog input signal, the method comprising the steps of:

controlling the capacitor switches to produce a plurality of binary-weighted DAC analog output signals;

producing a plurality of net capacitor voltages corresponding to the difference between the sampled analog input signal and a respective one of the plurality of DAC analog output signals, each net capacitor voltage having a prescribed settling time associated therewith;

determining, during an acquisition phase, a difference between a respective net capacitor voltage and a bias voltage using the comparator and producing a difference signal thereof;

converting, during a portion of a respective latch phase, the difference signal to a logic level bit decision;

asynchronously updating a bit of the ADC digital output signal as soon as a bit decision results;

asynchronously initiating, as soon as a bit decision results, a test of a next lower significant bit in the DAC to produce a next net capacitor voltage;

whereby the capacitors begin to settle within a remaining portion of the latch phase, thereby resulting in a reduction in required acquisition phase duration and a corresponding decrease in ADC power requirements.

23. The method of claim 22, wherein the plurality of capacitors each comprise a top plate and a bottom plate, the method further comprising the steps of:

coupling each of the capacitor switches to the bottom plate of a respective one of the plurality of capacitors; and wherein the step of producing a plurality of net capacitor voltages further includes coupling the plurality of top plates to the sampled analog input signal and to the comparator;

whereby the sampled analog input voltage is immediately available on the top plate for acquisition by the comparator.

24. The method of claim 22, the method further comprising the steps of:

defining a charging phase coincident with a latch phase in which a least significant bit (LSB) of the ADC digital output signal of a previous analog input signal is determined by the ADC, the bit determined in a subsequent latch phase being a most significant bit (MSB) of the ADC digital output signal for a next sampled analog input signal;

coupling, during the charging phase, the top plate to the sampled analog input signal to charge the plurality of capacitors to a top plate voltage; and presetting, during the charging phase, the capacitor switch position corresponding to the most significant so that the ADC performs bipolar conversion starting at a midrange digital output signal value;

whereby ADC conversion time and power requirements are minimized because no charge redistribution phase from the bottom plate to the top plate is required.

25. The method of claim 23, wherein the analog-to-digital converter further includes an offset correction digital-to-analog converter (OFFDAC), the method further comprising the steps of:

setting to zero at least one input in the signal path prior to the ADC to produce an analog offset signal;

converting the analog offset signal to a offset correction word representing the global input-referred offset voltage using the DAC; and converting the offset correction word to an offset correction voltage using the OFFDAC, wherein the offset correction voltage is coupled into the at least one input in the signal path of the ADC.

26. The method of claim 23, wherein the ADC has a power gated buffer amplifier, the method further comprising the steps of:

defining a charging phase coincident with a latch phase in which a least significant bit (LSB) of the ADC digital output signal of a previous analog input signal is determined by the ADC, the bit determined in a subsequent latch phase being a most significant bit (MSB) of the ADC digital output signal for a next sampled analog input signal;

operating the sampling circuitry at a low frequency and at a low power level;

operating the D/A converter at a high frequency and at a high power level;

receiving the sampled analog input signal using the power gated buffer amplifier and for providing a buffered output signal thereof; and switching an operating power level of the switched buffer amplifier from the low power level to the high power level during the charging phase to thereby provide a power gated buffered output signal before the most significant bit (MSB) of the digital output signal is determined;

whereby limiting the operating power level in this manner substantially reduces power requirements of the ADC.

* * * * *